United States Patent
Olsen et al.

(10) Patent No.: US 7,972,933 B2
(45) Date of Patent: Jul. 5, 2011

(54) METHOD OF SELECTIVE NITRIDATION

(75) Inventors: Christopher S. Olsen, Fremont, CA (US); Johanes Swenberg, Los Gatos, CA (US); Udayan Ganguly, Sunnyvale, CA (US); Theresa Kramer Guarini, San Jose, CA (US); Yonah Cho, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/748,523

(22) Filed: Mar. 29, 2010

(65) Prior Publication Data
US 2010/0248435 A1    Sep. 30, 2010

Related U.S. Application Data

(60) Provisional application No. 61/165,179, filed on Mar. 31, 2009.

(51) Int. Cl.
*H01L 21/76* (2006.01)
(52) U.S. Cl. ......... 438/431; 257/E21.079; 257/E21.267; 257/E21.301; 438/770; 438/911
(58) Field of Classification Search ........... 257/E21.079, 257/E21.267, E21.301; 438/431, 770, 911
See application file for complete search history.

(56) References Cited

U.S. PATENT DOCUMENTS

| | | | |
|---|---|---|---|
| 6,515,329 B2 | 2/2003 | Lee et al. | |
| 6,620,705 B1 | 9/2003 | Ogle et al. | |
| 7,226,874 B2 | 6/2007 | Matsuyama et al. | |
| 7,232,772 B2 | 6/2007 | Matsuyama et al. | |
| 7,294,581 B2 | 11/2007 | Iyer et al. | |
| 7,300,843 B2 | 11/2007 | Lee | |
| 7,416,995 B2 | 8/2008 | Iyer et al. | |
| 7,465,669 B2 | 12/2008 | Iyer et al. | |
| 7,645,709 B2 | 1/2010 | Chua et al. | |
| 2005/0164523 A1 | 7/2005 | Sugawara et al. | |
| 2005/0287731 A1 * | 12/2005 | Bian et al. | 438/201 |
| 2006/0134864 A1 * | 6/2006 | Higashitani et al. | 438/257 |
| 2007/0093012 A1 | 4/2007 | Chua et al. | |
| 2007/0207627 A1 * | 9/2007 | Dong et al. | 438/769 |
| 2008/0014729 A1 | 1/2008 | Lee et al. | |
| 2008/0179715 A1 * | 7/2008 | Coppa | 257/647 |
| 2009/0035927 A1 | 2/2009 | Olsen et al. | |
| 2009/0152629 A1 * | 6/2009 | Hu et al. | 257/344 |
| 2009/0233453 A1 | 9/2009 | Mani et al. | |
| 2010/0062603 A1 | 3/2010 | Ganguly et al. | |
| 2010/0317186 A1 * | 12/2010 | Swenberg et al. | 438/593 |

OTHER PUBLICATIONS

U.S. Appl. No. 12/749,088, filed Mar. 29, 2010, Bevan et al.
International Search Report and Written Opinion mailed Oct. 29, 2010 for PCT Application No. PCT/US2010/028998.

* cited by examiner

*Primary Examiner* — Asok K Sarkar
(74) *Attorney, Agent, or Firm* — Alan Taboada; Moser IP Law Group

(57) ABSTRACT

Methods of forming semiconductor devices are provided herein. In some embodiments, a method of forming a semiconductor device may include providing a substrate having an oxide surface and a silicon surface; forming a nitrogen-containing layer on exposed portions of both the oxide and silicon surfaces; and oxidizing the nitrogen-containing layer to selectively remove the nitrogen-containing layer from atop the oxide surface. In some embodiments, an oxide layer is formed atop a remaining portion of the nitrogen-containing layer formed on the silicon feature. In some embodiments, the oxide surface is an exposed surface of a shallow trench isolate region (STI) disposed adjacent to one or more floating gates of a semiconductor device. In some embodiments, the silicon surface is an exposed surface of a silicon or polysilicon floating gate of a semiconductor device.

20 Claims, 4 Drawing Sheets

METHOD OF SELECTIVE NITRIDATION

CROSS-REFERENCE TO RELATED APPLICATIONS

This application claims benefit of U.S. provisional application Ser. No. 61/165,179, filed Mar. 31, 2009, which is herein incorporated by reference.

FIELD

Embodiments of the present invention generally relate to the field of semiconductor manufacturing processes and devices, and more particularly, to a method of forming a device.

BACKGROUND

Scaling semiconductor devices by simply shrinking the device structure often does not produce acceptable results at small dimensions. In NAND flash memory devices, when a feature, such as a tunnel oxide layer, an inter poly dielectric (IPD) layer, or the like is scaled, undesired leakage can occur between, for example, a substrate and a floating gate, a floating gate and a control gate, or the like. Accordingly, and for example, to improve the reliability of a tunnel oxide layer or to suppress dopant out diffusion of a floating gate, each layer can have nitrogen incorporated therein or at a surface thereof, such as by a nitridization process.

Typically, such a nitridation process may be performed to incorporate nitrogen into the floating gate structure of a memory device. However, the nitridation process also undesirably incorporates nitrogen into shallow trench isolation (STI) regions, which separate adjacent floating gate structures. STI regions having nitrogen incorporation may undesirably electrically couple adjacent floating gate structures, resulting in electrical coupling between adjacent floating gates which can negatively impact final device performance. In some conventional processes, a wet chemical process may be utilized to try to remove the nitrogen in the STI regions after a nitridation process. Unfortunately, however, the wet chemical removal process also removes and degrades the desired nitrogen-containing layer formed atop the floating gate.

Accordingly, there is a need in the art for improved methods of fabricating semiconductor devices.

SUMMARY

Methods of forming semiconductor devices are provided herein. In some embodiments, a method of forming a semiconductor device may include providing a substrate having an oxide surface and a silicon surface; forming a nitrogen-containing layer on exposed portions of both the oxide and silicon surfaces; and oxidizing the nitrogen-containing layer to selectively remove the nitrogen-containing layer from atop the oxide surface. In some embodiments, an oxide layer is formed atop a remaining portion of the nitrogen-containing layer formed on the silicon feature. In some embodiments, the oxide surface is an exposed surface of a shallow trench isolate region (STI) disposed adjacent to one or more floating gates of a semiconductor device. In some embodiments, the silicon surface is an exposed surface of a silicon or polysilicon floating gate of a semiconductor device.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
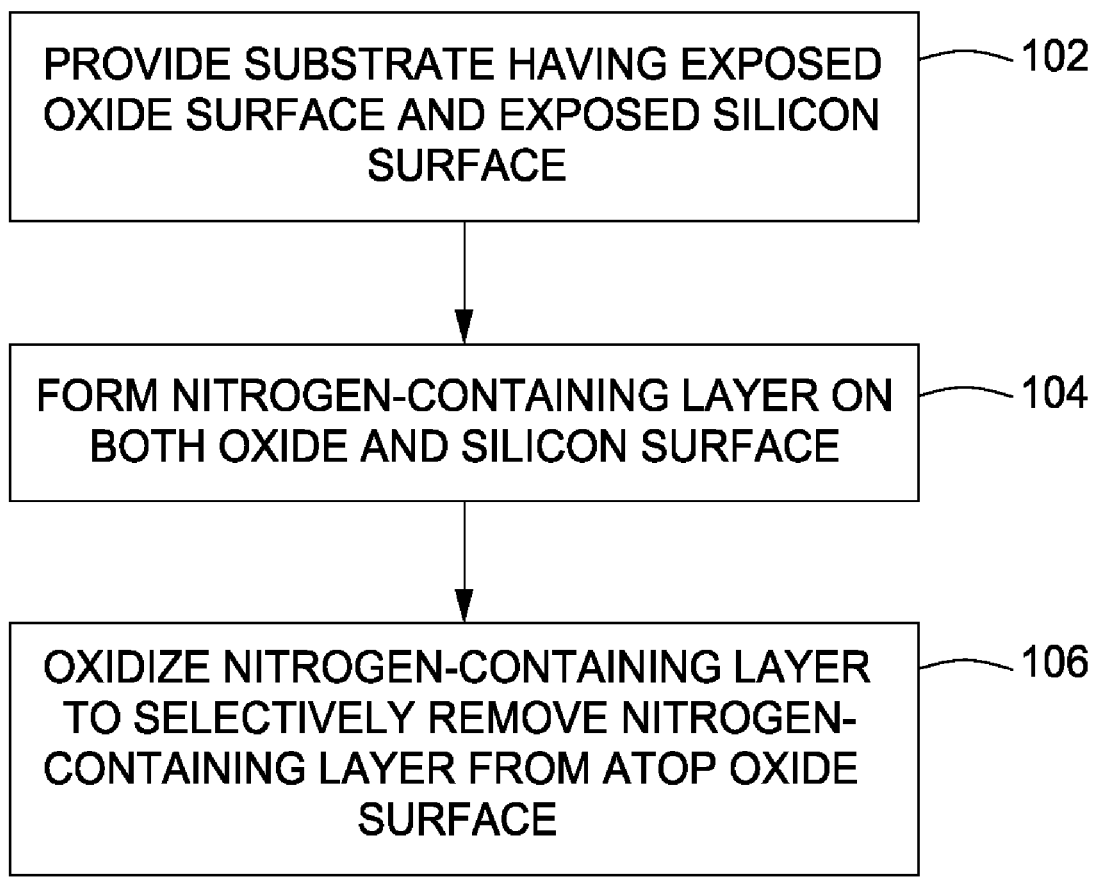
FIG. 1 depicts a flow chart for a method of forming a semiconductor device in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods of fabricating semiconductor devices are provided herein. Generally, the methods may include selective nitridation of an exposed silicon feature, for example, such as a floating gate structure of a Flash memory device and little or no nitridation of other exposed features, such as a shallow trench isolation (STI) region disposed between adjacent floating gate structures. The methods disclosed herein advantageously remove nitrogen from undesired exposed features with reduced or limited damage to the nitridized layer formed atop the exposed silicon feature.

FIG. 1 depicts a flow chart for a method of fabricating a semiconductor device in accordance with some embodiments of the present invention. The method 100 is described below in accordance with the stages of fabrication of an exemplary semiconductor device (memory device 200) depicted in FIGS. 2A-D. The method 100 selectively forms a nitrogen-containing layer at the surface of each floating gate layer while resulting in little or no nitrogen incorporation into undesired portions of the substrate (such as at surfaces of a field oxide of the substrate, STI structures, or the like). Although illustrated with respect to a floating gate and an oxide layer, such as STI structures and/or a field oxide, the methods disclosed herein may be utilized in combination with other structures disposed on the substrate, such as other oxide layers or structures, dielectric layers or structures, or the like.

Figure 2A:
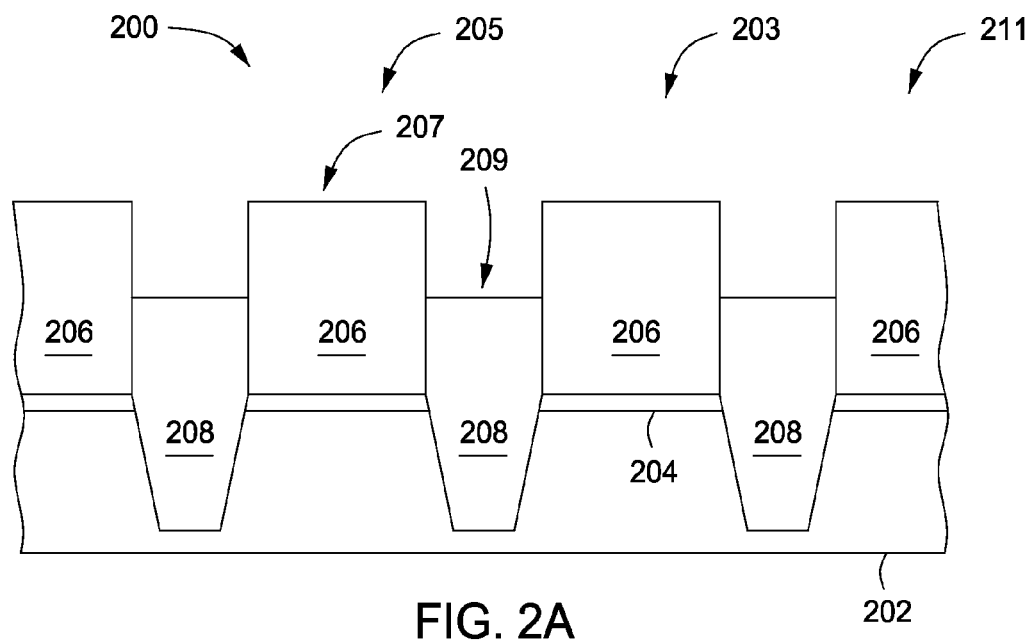
FIGS. 2A-D depict stages of fabrication of a semiconductor device in accordance with some embodiments of the method of FIG. 1.

The method 100 begins at 102 by providing a substrate 202 having an exposed oxide surface and an exposed silicon surface. Such a substrate 202 is depicted in FIG. 2A, which depicts a partially formed memory device 200 being formed on the substrate 202. The substrate 202 may comprise a suitable material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like. In some embodiments, the substrate 202 comprises silicon.

The partially formed memory device 200 includes a patterned floating gate layer 206 (that define a plurality of floating gates) having an exposed silicon surface 207. The floating gate 206 typically comprises a conductive material, such as polysilicon, metals, or the like. In some embodiments, the floating gate layer 206 may be formed of silicon (Si) or polysilicon (poly-Si), either of which may be doped or undoped. The floating gate 206 has a configuration suitable to facilitate disposing portions of the IPD layer 210 between adjacent cells (e.g., between cells 203, 205, and 211) as shown in FIG. 2D.

A tunnel oxide layer 204 is disposed between the substrate 202 and the floating gate layer 206. The tunnel oxide layer 204 may comprise silicon and oxygen, such as silicon oxide ($SiO_2$), silicon oxynitride (SiON), or high-k dielectric materials, such as aluminum—(Al), hafnium—(Hf), or lanthanum—(La), zirconium—(Zr) based oxides or oxinitrides, or silicon nitrides ($Si_XN_Y$), in single or layered structures (e.g., $SiO_2$/high-k/$SiO_2$), or the like.

The tunnel oxide layer 204 may be similarly patterned to correspond with the patterned floating gate layer 206. Each portion of the patterned floating gate layer 206, the tunnel oxide layer 204, and the underlying portion of the substrate 202 may comprise a cell 203 (or memory unit) of the memory device 200. The tunnel oxide layer 204 may have a width, within each cell, substantially equivalent to the width of a base of a respective floating gate defined by the patterned floating gate layer 206. The tunnel oxide layer 204 may have any suitable thickness, for example, between about 5 to about 12 nm.

Each cell of the memory device 200 may be separated by shallow trench isolation (STI) regions 208 that isolate adjacent cells and/or other devices (including other memory devices) on the substrate 202. For example, in the memory device 200, the shallow trench isolation (STI) regions 208 are disposed in the substrate 202 between each cell (for example, adjacent to each portions of the tunnel oxide layer 204 and floating gate layer 206, wherein the STI regions 208 separate the cell 203 from adjacent cells 205 and 211). The STI regions 208 may comprise silicon and oxygen, such as silicon oxide ($SiO_2$), silicon oxynitride (SiON), or the like. The STI regions 208 may extend to a sufficient height such to contact adjacent floating gates 206 in adjacent cells (e.g., cells 203 and 205).

Thus, at the stage of fabrication illustrated by FIG. 2A, the substrate 202 includes exposed oxide surfaces 209 (e.g., atop the STI regions 208) and exposed silicon surfaces 207 (e.g., atop the floating gate layer 206).

In some embodiments, prior to forming a nitrogen layer (discussed below at 104), there may be a preclean (wet or dry) which could leave a terminated surface on the silicon areas—chemical oxide or bare silicon. In some embodiments, a dry clean process leaving a bare silicon surface may be utilized, which can be integrated into the overall process. In this case, having the preclean integrated would be advantageous so as to avoid exposure to air and oxidizing the silicon. In some embodiments, a dopant implantation may occur prior to the nitridation at 104 so that the final dopant concentration is increased (as compared to not performing a pre-nitridation dopant process).

Figure 2B:
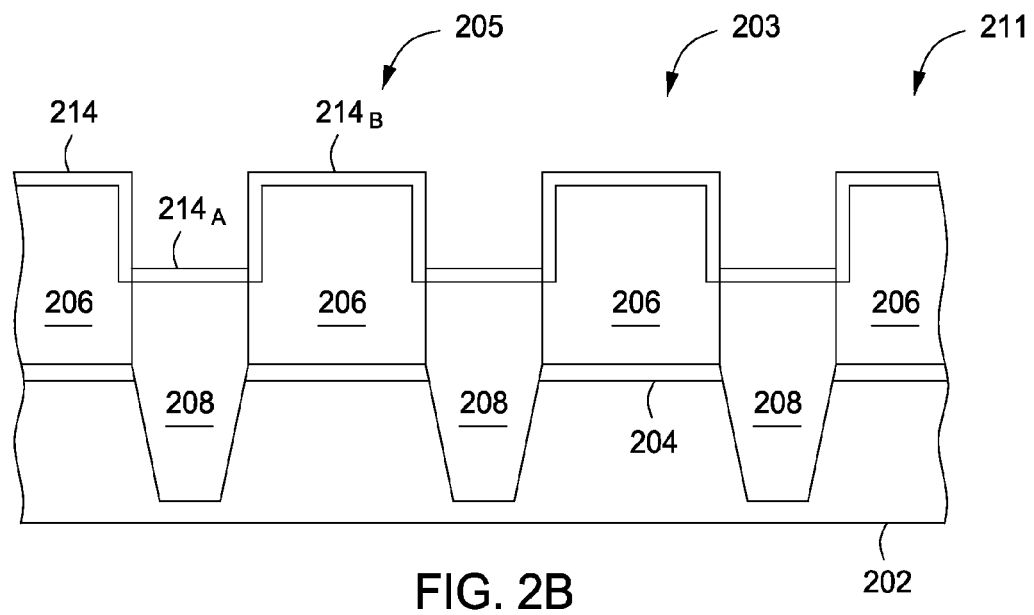

Next, at 104, a nitrogen-containing layer is formed on both the exposed oxide surface 209 of the STI region 208 and the exposed silicon surface 107 of the floating gate 206 as depicted in FIG. 2B. The nitrogen-containing layer 214 may comprise an oxynitride portion 214$_A$, for example, formed on the exposed surface 209 of the STI region 208 and/or a nitride portion 214$_B$, for example, formed on the exposed surface 207 of the floating gate 206. Exemplary oxynitride portions include silicon oxynitride (SiON). Exemplary nitride portions include silicon nitride (SiN). The nitrogen-containing layer 214 may have a thickness between about 0.2 to about 5 nm. The nitrogen-containing layer 208 may have a nitrogen content between about 1 to about 60%.

The nitrogen-containing layer 214 may be formed using any suitable nitridation process, for example, plasma nitridation using a decoupled plasma source. Exemplary chambers suitable for use with the present invention are any chamber configured for decoupled plasma nitridation (DPN) available from Applied Materials, Inc. of Santa Clara, Calif.

For example, an exemplary nitridation process includes forming a plasma from a process gas. The process gas includes at least nitrogen. For example, a suitable first process gas may include nitrogen ($N_2$), ammonia ($NH_3$), or a combination thereof. Optionally, the first process gas may further include an inert gas, such as argon (Ar), helium (He), krypton (Kr), xenon (Xe), or the like. In some embodiments, the first process gas is nitrogen ($N_2$) only.

The process gas may be supplied at a total gas flow from about 200 to about 1000 sccm, or at about 400 sccm. The first process gas may utilize a range of compositions. In some embodiments, the process may comprise between about 3 percent of $N_2$ (i.e., $N_2$ flow of between about 10 to about 50 sccm). In some embodiments, the process gas may comprise between about 3 to about 50 percent of $NH_3$ (i.e., a $NH_3$ flow of between about 10 to about 100 sccm). In some embodiments, the process gas may comprise between about 0 to about 97 percent of the inert gas (i.e., an inert gas flow of between about 0 to about 1000 sccm). For example, in one specific embodiment, $N_2$ comprising 100 may be provided at a rate of about 400 sccm.

A plasma may be formed from the process using, for example, an inductively coupled plasma source. In some embodiments, the plasma density is between about 1e9 to about 1e12 ions/$cm^3$. The plasma may be formed by using an RF source power. In some embodiments, the RF source power is between about 100 to about 5 kW. The RF source power may be provided at any suitable RF frequency. For example, in some embodiments, the RF source power may be provided at a frequency between about 13 MHz to about 90 MHz. In some embodiments, the RF source power may be provided at a frequency of about 13 Mhz. A pressure of a process chamber during the inductive nitridation process may be maintained at about 0.005 Torr to about 0.5 Torr, or at about 0.05 Torr The substrate 202 may be heated during the nitridation process. For example, the substrate 202, STI region 208, and floating gate 206 may be heated such that the temperature of the exposed surfaces is between about 100 to about 500 degrees Celsius. Increase temperature range may facilitate a higher nitridation rate and/or a higher nitrogen content and may change the nitridation rate difference between silicon areas and $SiO_2$ areas. In some embodiments, and at a temperature between about 300 to about 450 degrees Celsius, the nitrogen content incorporated into the floating gate may be between about 15 to about 30%. In some embodiments, and at a temperature between about 300 to about 450 degrees Celsius, the nitrogen content incorporated into the STI region may be between about 5 to about 20%.

In some embodiments, RF bias power may optionally be applied, such as between about 50 to about 500 Watts. The RF bias power may be applied at any suitable frequency range, such as between about 13.5 MHz to about 60 MHz.

Figure 2C:
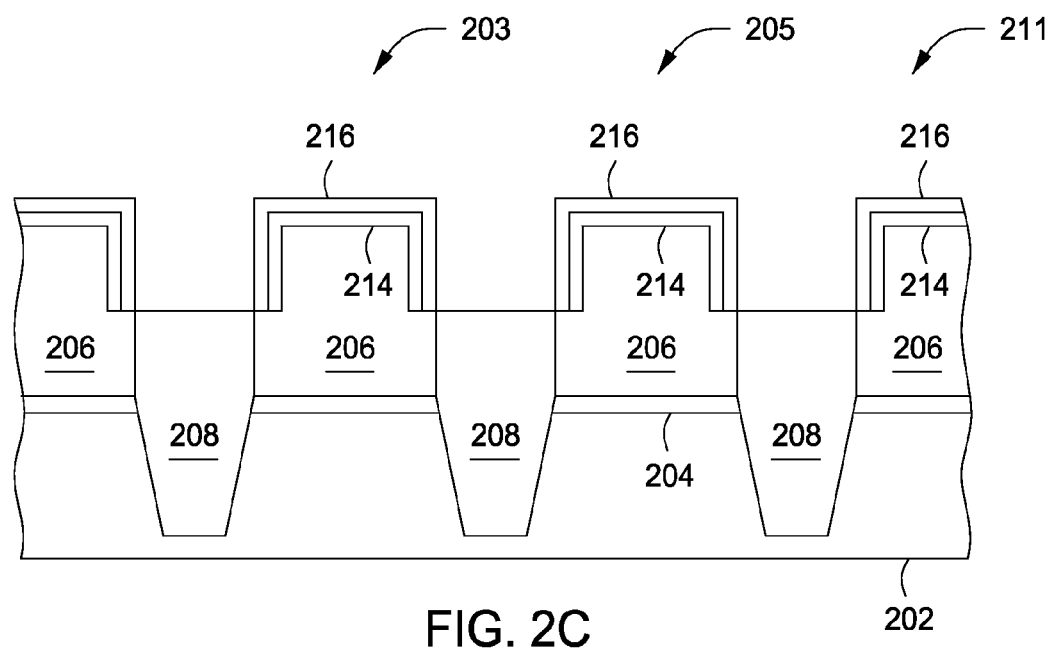
Figure 2D:
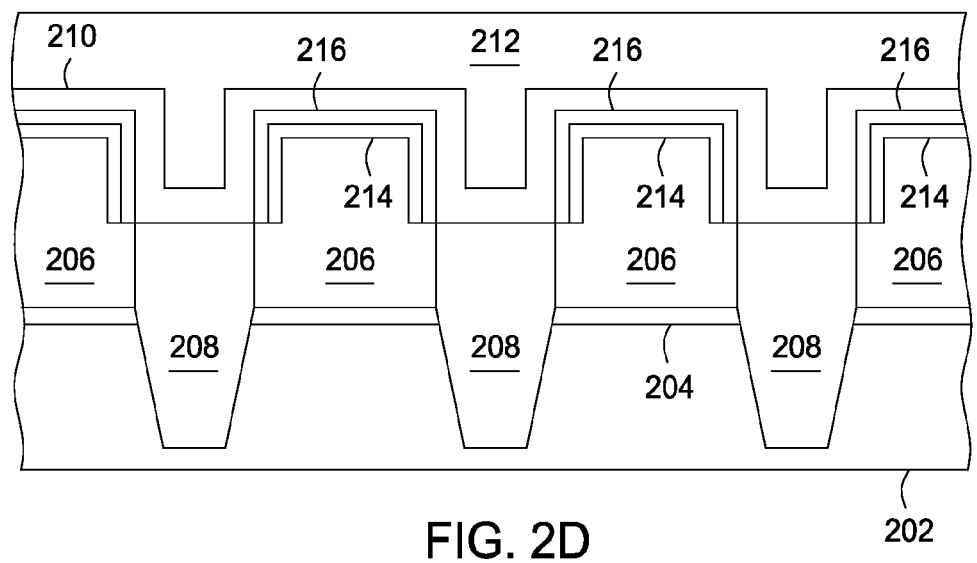

Next, at 106, the nitrogen-containing layer 214 may be oxidized while, simultaneously, the nitrogen-containing layer from STI region 208 may be selectively removed as depicted in FIG. 2C. The nitrogen-containing layer is selectively removed from atop the STI region 208, for example, to limit or eliminate any conductive path between adjacent floating gates 206 in adjacent cells. The nitrogen-containing silicon surface (214) is oxidized which results in a final SiON layer (216). The oxide layer 216 has a thickness between about 0.2 to about 5 nm. In some embodiments, the oxide layer 216 may be utilized as part of the IPD layer 210, such as a first oxide layer of an ONO layer as discussed below.

The oxidation process for the selective removal of the nitrogen-containing layer may be any suitable oxidation process including plasma oxidation such as decoupled plasma oxidation (DPO), rapid thermal oxidation (RTO) such as spike RTP, radical oxidation, spike radical oxidation, thermal nitridation, or the like. There may be combinations of processes, such as an anneal followed by radical oxidation. Exemplary process chambers suitable for performing the oxidation process of the inventive method include the RADIANCE® or RADOX™ RTP chambers, available from Applied Materials, Inc. of Santa Clara, Calif.

An oxidizing process gas is provided and includes at least an oxygen-containing gas. In some embodiments, the process gas comprises hydrogen ($H_2$) and oxygen ($O_2$). In some embodiments, hydrogen ($H_2$) may be less than about 1 percent, or less than about 3 percent, or less than about 6 percent, or up to about 80 percent of the total amount of hydrogen ($H_2$) and oxygen ($O_2$) provided. In some embodiments, the hydrogen ($H_2$) may be about 3 to about 33 percent of the total amount of oxygen ($O_2$) and hydrogen ($H_2$) provided (e.g., a flow rate ratio of hydrogen ($H_2$) to oxygen ($O_2$) about 1:1 to about 4:1). In some embodiments, the hydrogen ($H_2$) may be about 0.5 percent, or about 1 percent, or about 3 percent, or about 6 percent of the total amount of oxygen ($O_2$) and hydrogen ($H_2$) provided. In some embodiments, the oxidizing process gas comprises hydrogen ($H_2$) and nitrous oxide ($N_2O$) in the same flow ratios as discussed above.

In some embodiments, the oxidizing process gas may be provided at total flow rate of up to 50 slm, or between about 20 to about 30 slm. In some embodiments, the inert gases may be provided as necessary to provide a total flow rate of between about 20 to about 30 slm. In some embodiments, the inert gases may be provided as necessary to provide a process gas mixture having a content of about 50 percent or higher hydrogen ($H_2$). In some embodiments, the one or more inert gases may include argon (Ar), helium (He), krypton (Kr), neon (Ne), or the like. The addition or one or more inert gases to the process gas may facilitate higher oxidation rates. In one specific embodiment, oxygen ($O_2$) is provided at about 19 slm, hydrogen ($H_2$) is provided at about 1 slm. In some embodiments, the plasma oxidation gases may include combinations of $O_2$ with $H_2$ as discussed above, with an inert gas from between about 5 to about 95 percent of the total gas flow.

In embodiments of the oxidizing process where an oxidizing plasma is formed from the oxidizing process gas (e.g., such as decoupled plasma oxidation), the oxidizing plasma may be formed by applying an RF source power between about 50 W to about 2500 W at a suitable frequency to form a plasma (for example, in the MHz, range, or at about 13.56 MHz or greater. In some embodiments, the oxidizing plasma is formed at densities of between about 1e9 to about 1e12 ions/cm$^3$.

The oxide layer 216 may be formed at a pressure between about 0.005 to about 15 Torr. Alternatively or in combination, the substrate 202 may be maintained at higher temperatures to facilitate increased oxidation rate, for example, the temperature of the substrate 202 may be heated to between about room temperature to about 550 degrees Celsius.

In embodiments where an oxidizing plasma is formed from the oxidizing process gas, the substrate 202 may be biased during formation of the oxide layer 216 to control the flux of the oxidizing plasma to the surface of the nitrogen-containing layer 214, and, in some embodiments, to control the thickness of the oxide layer formed. In some embodiments, the bias power applied to the substrate 202 is about 50 to about 500 Watts.

In embodiments where the nitrogen-containing layer 214 is oxidized in a thermal oxidation process, the process may be performed at a temperature greater than 600 and less than 1100 degrees Celsius. In some embodiments, the process gas provided during the thermal oxidation process may include hydrogen ($H_2$) and an oxygen-containing gas. The hydrogen ($H_2$) and oxygen-containing gas may be reacted at a total chamber pressure of less than about 20 Torr.

In some embodiments, it may be desired to remove the nitrogen-containing layer 214 from atop the STI region 208 while minimizing oxide layer formation atop the remaining portion of the nitrogen-containing layer 214. For example, the minimization of oxide layer formation may be desired to preserve scaling in the memory device 200. Thus, process conditions of the oxidation process may be adjusted such that a trade off exists between nitrogen removed from atop the STI region 208 and oxide layer formation atop the remaining nitrogen-containing layer 214. For example, such process conditions may include lowering temperature, reducing thermal budget such as by utilizing a spike RTP process, adjusting process gas concentration, pressure, flow rates, or combinations thereof. As an example, a low temperature radical oxidation process with temperature of 700 degrees Celsius and soak times of about 10 to about 60 sec with H2% (in $O_2$) of 3 to 33% may be used. Additionally, a spike radical oxidation process with a peak temperature of up to 950 degrees Celsius could be used with oxidizing gas combinations as discussed above.

Optional processes that may be performed in combination with or after the method 100 is completed. For example, a wet etch may be utilized prior to the oxidation process to remove a portion of the nitrogen-containing layer 214 disposed atop the STI region 208. A wet etch may include dipping the device 200 in an acid, for example, such as hydrofluoric acid (HF) or hydrochloric acid (HCL). An anneal may be used prior to the wet etch to densify the nitrogen. Further, the device 200 may be annealed prior to oxidation at high temperature to, for example, homogenize and stabilize the nitrogen-containing layer 214 prior to selective oxidation at 106. The device 200 may be annealed after oxidation at high temperature for similar reasoning prior to deposition of the IPD layer 210. Further, a wet etch may be performed after the oxidation process, for example, to remove residual nitrogen-containing species from atop the STI region 208 without removing the oxide layer 216 (in some embodiments, an SiON layer) on the floating gate.

In some embodiments, the method 100 may end with the selective removal of the nitrogen-containing layer 214, however, other processes may be performed to complete the device 200, as depicted in FIG. 2D. For example, an interpoly dielectric (IPD) layer 210 may be formed above the floating gate layer 206 and a control gate layer 212 may be formed over the IPD layer 210, as shown in FIG. 2D. The IPD layer 210 separates each floating gate 206 from the control gate layer 212. The IPD layer may be disposed atop the oxide layer 216 and atop the STI region 208 and in any vacant region between adjacent floating gates 206. The IPD layer 210 may comprise any suitable single or multi-layer dielectric materials. A single layer IPD may comprise $SiO_2$, SiON, or a high-k dielectric material as discussed above with respect to tunnel oxide layer 104, or the like. A non-limiting example of a multi-layer IPD is a multi-layer ONO layer comprising a first oxide layer, a nitride layer, and a second oxide layer, or a multi-layer OAO layer comprising a first oxide layer, an aluminum oxide layer, and a second oxide layer. The first and second oxide layers typically comprise silicon and oxygen, such as silicon oxide ($SiO_2$), silicon oxynitride (SiON), or the like. The nitride layer typically comprises silicon and nitrogen, such as silicon nitride (SiN), or the like. In some embodiments, a multi-layer IPD layer comprising $SiO_2$/high-k/$SiO_2$ (such as, $SiO_2$/$Al_2O_3$/$SiO_2$) can also be used as the IPD layer 110. In some embodiments, the IPD layer 210 is deposited to a thickness of between about 12 to about 15 nm.

The control gate layer 212 may be deposited above the IPD layer 210 as shown in FIG. 2D. Optionally, a nitrogen-containing layer (not shown) may be deposited atop the IPD layer 210 prior to deposition of the control gate 212. The control gate layer 212 typically comprises a conductive material, such as polysilicon, metal, or the like.

Figure 3:
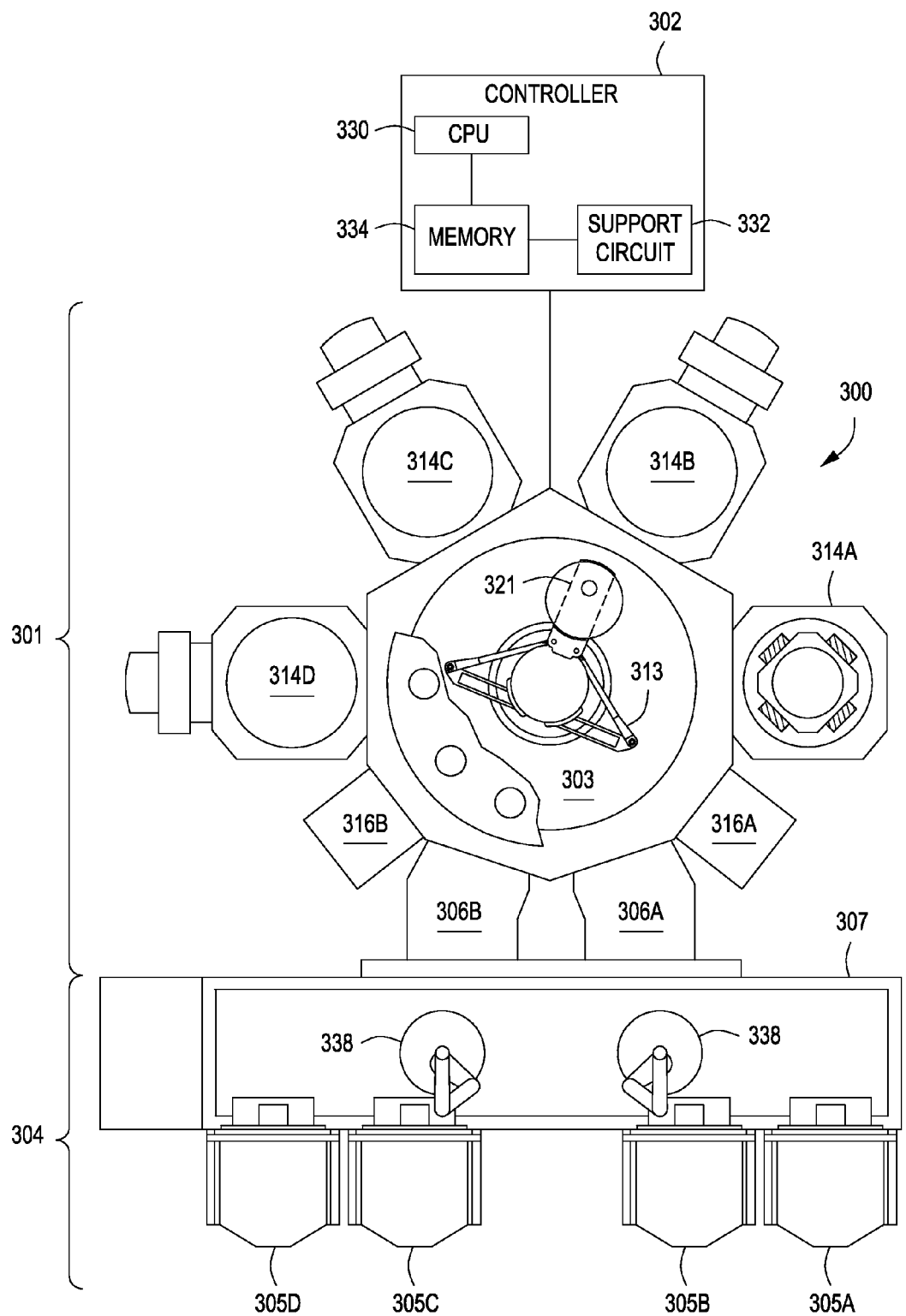
FIG. 3 depicts a cluster tool suitable for performing portions of the present invention.

The methods described herein, for example, such as nitridation and oxidation processes may be performed in individual nitridation and oxidation chambers, such as the exemplary chambers discussed above, that may be provided in a standalone configuration or as part of a cluster tool, for example, an integrated tool 300 (i.e., cluster tool) described below with respect to FIG. 3. Examples of the integrated tool 300 include the CENTURA® and ENDURA® integrated tools, for example the CENTURA® DPN Gate Stack, all available from Applied Materials, Inc., of Santa Clara, Calif. It is contemplated that the methods described herein may be practiced using other cluster tools having suitable process chambers coupled thereto, or in other suitable process chambers.

The integrated tool 300 includes a vacuum-tight processing platform 301, a factory interface 304, and a system controller 302. The platform 301 comprises multiple processing chambers, such as 314A, 314B, 314C, and 314D operatively coupled to a vacuum substrate transfer chamber 303. The factory interface 304 is operatively coupled to the transfer chamber 303 by one or more load lock chambers (two load lock chambers, such as 306A and 306B shown in FIG. 3).

In some embodiments, the factory interface 304 comprises at least one docking station 307, at least one factory interface robot 338 to facilitate the transfer of the semiconductor substrates. The docking station 307 is configured to accept one or more front opening unified pod (FOUP). Four FOUPS, such as 305A, 305B, 305C, and 305D are shown in the embodiment of FIG. 3. The factory interface robot 338 is configured to transfer the substrates from the factory interface 304 to the processing platform 301 through the loadlock chambers, such as 306A and 306B. Each of the loadlock chambers 306A and 306B have a first port coupled to the factory interface 304 and a second port coupled to the transfer chamber 303. The load lock chamber 306A and 306B are coupled to a pressure control system (not shown) which pumps down and vents the chambers 306A and 306B to facilitate passing the substrates between the vacuum environment of the transfer chamber 303 and the substantially ambient (e.g., atmospheric) environment of the factory interface 304. The transfer chamber 303 has a vacuum robot 313 disposed therein. The vacuum robot 313 is capable of transferring substrates 321 between the load lock chamber 306A and 306B and the processing chambers 314A, 314B, 314C, and 314D.

In some embodiments, the processing chambers 314A, 314B, 314C, and 314D, are coupled to the transfer chamber 303. The processing chambers 314A, 314B, 314C, and 314D comprise at least one of an oxidation chamber, a nitridation chamber, and optionally, an etch chamber, and a deposition chamber for depositing a tunnel oxide layer, a material layer, an IPD layer, a control gate layer, or the like. Oxidation chambers may include those configured for plasma oxidation, rapid thermal oxidation, or radical oxidation. A nitridation chamber may include those configured for decoupled plasma nitridation (DPN) and the like. Etch chambers may include those configured for wet or dry etch, reactive ion etch (RIE), or the like. Examples of chambers suitable for performing at least some of the embodiments of the invention have been discussed above.

In some embodiments, one or more optional service chambers (shown as 316A and 316B) may be coupled to the transfer chamber 303. The service chambers 316A and 316B may be configured to perform other substrate processes, such as degassing, orientation, substrate metrology, cool down and the like.

The system controller 302 controls the operation of the tool 300 using a direct control of the process chambers 314A, 314B, 314C, and 314D or alternatively, by controlling the computers (or controllers) associated with the process chambers 314A, 314B, 314C, and 314D and the tool 300. In operation, the system controller 302 enables data collection and feedback from the respective chambers and systems to optimize performance of the tool 300. The system controller 302 generally includes a Central Processing Unit (CPU) 330, a memory 334, and a support circuit 332. The CPU 330 may be one of any form of a general purpose computer processor that can be used in an industrial setting. The support circuit 332 is conventionally coupled to the CPU 330 and may comprise a cache, clock circuits, input/output subsystems, power supplies, and the like. Software routines, such as a method of forming an floating gate as described above, when executed by the CPU 330, transform the CPU 330 into a specific purpose computer (controller) 302. The software routines may also be stored and/or executed by a second controller (not shown) that is located remotely from the tool 300.

Thus, method for fabricating semiconductor devices are provided herein. The method advantageously selectively removes a deposited nitrogen-containing layer from a exposed oxide feature with reduced or limited damage to the nitrogen-containing layer formed atop a exposed silicon feature.

While the foregoing is directed to embodiments of the present invention, other and further embodiments of the invention may be devised without departing from the basic scope thereof.

The invention claimed is:

1. A method of forming a semiconductor device, comprising:
    providing a substrate having an oxide surface and a silicon surface;
    forming a nitrogen-containing layer on exposed portions of both the oxide and silicon surfaces; and
    oxidizing the nitrogen-containing layer to selectively remove the nitrogen-containing layer from atop the oxide surface.

2. The method of claim 1, further comprising:
    forming an oxide layer atop a remaining portion of the nitrogen-containing layer formed on the silicon feature.

3. The method of claim 1, wherein the oxide surface includes an exposed surface of a shallow trench isolate region (STI) disposed adjacent to one or more floating gates of a semiconductor device.

4. The method of claim 1, wherein the silicon surface is an exposed surface of a silicon or polysilicon floating gate of a semiconductor device.

5. The method of claim 1, further comprising:
performing a preclean process on the substrate prior to forming the nitrogen containing layer to provide a terminated surface on the silicon surface.

6. The method of claim 1, wherein forming the nitrogen-containing layer comprises:
forming an oxynitride portion of the nitrogen-containing layer atop the oxide surface; and
forming a nitride portion of the nitrogen-containing layer atop the silicon surface.

7. The method of claim 6, wherein the oxynitride portion comprises silicon oxynitride (SiON) and wherein the nitride portion comprises silicon nitride (SiN).

8. The method of claim 1, wherein forming the nitrogen-containing layer comprises forming the nitrogen-containing layer to a thickness of about 0.2 to about 5.0 nanometers.

9. The method of claim 1, wherein forming the nitrogen-containing layer comprises forming the nitrogen-containing layer having a nitrogen content between about 1 to about 60 percent.

10. The method of claim 1, further comprising:
performing a dopant implantation process prior to forming the nitrogen containing layer to increase a dopant concentration within the substrate.

11. The method of claim 1, further comprising at least one of:
performing a wet etch after forming the nitrogen-containing layer and prior to oxidizing the nitrogen-containing layer to remove a portion of the nitrogen-containing layer from atop the oxide surface; or
performing a wet etch after oxidizing the nitrogen-containing layer to remove a residual nitrogen-containing species from atop the oxide surface.

12. The method of claim 1, further comprising;
forming an inter-poly dielectric layer atop the exposed silicon surface after oxidizing the nitrogen-containing layer; and
forming a control gate layer atop the inter-poly dielectric layer.

13. The method of claim 1, wherein the nitrogen-containing layer is formed in a plasma nitridation process.

14. The method of claim 13, wherein the plasma nitridation process comprises:
forming a plasma from a process gas comprising a nitrogen containing gas; and
exposing the substrate to the plasma to form the nitrogen-containing layer.

15. The method of claim 14, wherein the nitrogen containing gas comprises at least one of nitrogen ($N_2$) or ammonia ($NH_3$).

16. The method of claim 13, further comprising:
heating the substrate while performing the plasma nitridation process to increase at least one of a nitridation rate or a nitrogen content of the nitrogen-containing layer.

17. The method of claim 1, wherein the nitrogen-containing layer is oxidized in a plasma oxidation process.

18. The method of claim 17, wherein the plasma oxidation process comprises:
forming a plasma from a process gas comprising oxygen ($O_2$) and one of hydrogen ($H_2$), helium (He), nitrogen ($N_2$), or argon (Ar); and
exposing the substrate to the plasma to oxidize the nitrogen-containing layer.

19. The method of claim 1, wherein the nitrogen-containing layer is oxidized in a thermal oxidation process at temperature greater than 600 and less than 1100 degrees Celsius.

20. The method of claim 19, wherein the thermal oxidation process comprises:
reacting hydrogen ($H_2$) and an oxygen-containing gas at a total chamber pressure less than 20 Torr.

* * * * *